(12) United States Patent
Cook

(10) Patent No.: US 6,167,837 B1
(45) Date of Patent: Jan. 2, 2001

(54) APPARATUS AND METHOD FOR PLASMA ENHANCED CHEMICAL VAPOR DEPOSITION (PECVD) IN A SINGLE WAFER REACTOR

(75) Inventor: Robert C. Cook, Livermore, CA (US)

(73) Assignee: Torrex Equipment Corp., Livermore, CA (US)

(*) Notice: Under 35 U.S.C. 154(b), the term of this patent shall be extended for 0 days.

(21) Appl. No.: 09/228,835

(22) Filed: Jan. 12, 1999

Related U.S. Application Data

(60) Provisional application No. 60/071,572, filed on Jan. 15, 1998.

(51) Int. Cl.[7] .............................. C23C 16/00; H05H 1/00
(52) U.S. Cl. ...................... 118/723 E; 118/724; 156/345
(58) Field of Search .............................. 118/723 E, 728, 118/724, 733; 156/345

(56) References Cited

U.S. PATENT DOCUMENTS

| | | | |
|---|---|---|---|
| 4,105,810 | 8/1978 | Yamazaki et al. | 427/248 |
| 4,693,777 | 9/1987 | Hazano et al. | 156/345 |
| 4,745,088 | 5/1988 | Inoue et al. | 437/102 |
| 4,870,245 | 9/1989 | Price et al. | 219/121.36 |
| 4,951,601 | 8/1990 | Maydan et al. | 118/719 |
| 4,969,416 | 11/1990 | Schumaker et al. | 118/725 |
| 5,203,956 | 4/1993 | Hansen | 156/643 |
| 5,272,417 | 12/1993 | Ohmi | 315/111.21 |
| 5,291,030 | 3/1994 | Brors | 250/573 |
| 5,458,724 | 10/1995 | Syverson et al. | 156/345 |
| 5,493,987 | 2/1996 | McDiarmid et al. | 117/102 |
| 5,551,985 | 9/1996 | Brors et al. | 118/725 |
| 5,556,521 * | 9/1996 | Ghanbari | 118/723 I |
| 5,558,717 * | 9/1996 | Zhao et al. | 118/723 E |
| 5,563,092 * | 10/1996 | Ohmi | 118/723 E |
| 5,626,678 | 5/1997 | Sahin et al. | 118/723 E |
| 5,663,087 | 9/1997 | Yokozawa | 438/762 |
| 5,695,566 * | 12/1997 | Suzuki et al. | 118/723 E |
| 5,844,195 | 12/1998 | Fairbain et al. | 219/121.43 |
| 6,074,518 * | 6/2000 | Imafuku et al. | 156/345 |

FOREIGN PATENT DOCUMENTS

| | | |
|---|---|---|
| 61-197638 | 9/1986 | (JP) . |
| 3-011546 | 1/1991 | (JP) . |
| 8-138620 | 5/1996 | (JP) . |

OTHER PUBLICATIONS

S. Wolf and R.N. Tauber "Silicon Processing for the VSLI Era," vol. 1, Process Technology, Lattice Press, 1986, pp. 191–194, (No Month).

\* cited by examiner

Primary Examiner—Richard Bueker
Assistant Examiner—P. Hassanzadeh
(74) Attorney, Agent, or Firm—David H. Jaffer; Pillsbury Madison & Sutro

(57) ABSTRACT

A PECVD reactor for processing a single wafer. The reactor has a susceptor for holding a wafer horizontally, an apparatus for lifting the wafer from the susceptor for loading and unloading. The horizontally positioned thermal plate is positioned above the susceptor for uniform transfer of radiant heat energy from heat lamps to the wafer. The thermal plate also serves as an RF plate, being constructed of an electrically conductive material and connected to an RF transmission line and connector for receiving RF energy from an RF generator for the purpose of providing an RF field for plasma enhancement. The thermal plate is configured thinner near its edges, so as to space the plate further from the susceptor and thicker near the center, placing it closer to the susceptor.

8 Claims, 10 Drawing Sheets

SECTION D

APPARATUS AND METHOD FOR PLASMA ENHANCED CHEMICAL VAPOR DEPOSITION (PECVD) IN A SINGLE WAFER REACTOR

This application claims the benefit of U.S. Provisional Application No. 06/071,572 filing date Jan. 15, 1998.

BACKGROUND OF THE INVENTION

1. Field of the Invention

The present invention relates generally to methods and apparatus for plasma enhanced chemical vapor deposition (PECVD), and more particularly to a method and apparatus for PECVD in a single wafer reactor that provides control of reactant gas over the surface of a wafer for more uniform processing, and provides for introduction of added dopant gases, and for wafer susceptor biasing to control the rate of ion incident on a wafer

2. Brief Description of the Prior Art

There are a large number of plasma enhanced chemical vapor deposition processes that are performed inside of enclosed chambers wherein the pressure, temperature, composition gases and application of radio frequency (RF) power are controlled to produce the desired thin film deposition of various materials onto substrates such as semiconductor wafers, flat panel displays and others. For convenience, the term "wafer" will be used in the following disclosure with the understanding that it also applies to the manufacture of flat panel and other types of substrates or devices wherein PECVD processes are employed. For example, silicon nitride is typically deposited via plasma enhanced chemical vapor deposition (PECVD) on top of metal layers on a semiconductor wafer.

A main feature of the PECVD process is that it can be carried out at low substrate temperatures as described by S. Wolf and R. N. Tauber, "Silicon Processing for the VLSI Era", Volume 1—Process Technology, Lattice Press, 1986, pp. 171–174. FIG. 1 shows a prior art chamber 10 having a rotating susceptor 12 capable of holding a plurality of substrates 14. RF energy is applied to an upper electrode 16 to create a plasma (glow discharge), creating free electrons within the plasma region. The electrons gain sufficient energy from the electric field so that when they collide with gas molecules, gas-phase dissociation and ionization of the reactant gases (e.g. silane and nitrogen) occurs. The energetic species are then absorbed on the film surface of the wafers.

There are a variety of single wafer PECVD chamber designs available in the marketplace. There are also a variety of commercially available multiple wafer chambers, similar to the one shown in FIG. 1, wherein the wafers are all supported by a susceptor on a single horizontal plane.

The single wafer and horizontal multiple wafer PECVD chamber designs of the prior art, as described above, are problematic for numerous reasons. Single wafer designs suffer from the need to operate at relatively high pressures (>0.8 Torr) in order to achieve acceptable deposition rates and uniform film thickness across a wafer. Multiple wafer horizontal designs pose extreme difficulties in connection with the incorporation of automatic robotic wafer loading and unloading. Also, horizontal multiple wafer designs can process only a limited number of wafers before the chamber becomes so large in area that it becomes very difficult to maintain the necessary plasma uniformity and gas flow control.

It is apparent from the above description of the prior art that there is a need for a PECVD chamber that provides an improved material deposition rate and uniform thickness across a wafer, as well as facility for automatic robotic wafer loading and unloading.

SUMMARY OF THE INVENTION

It is therefore an object of the present invention to provide a PECVD reactor yielding improved uniformity of material deposition across a wafer.

It is a further object of the present invention to provide a PECVD reactor having provision for application of RF energy for plasma enhancement, and provision for retarding incident ions on a wafer.

It is a still further objective of the present invention to provide a PECVD reactor having provision for introducing a controlled concentration of dopant across a wafer.

Briefly, a preferred embodiment of the present invention includes a PECVD reactor providing enhanced uniformity of deposition on a single wafer. The reactor has a susceptor for holding a wafer horizontally, and an apparatus for lifting the wafer from the susceptor for loading and unloading. A horizontally positioned thermal plate is positioned above the susceptor for uniform transfer of radiant heat energy from heat lamps to the wafer. The thermal plate also serves as an RF plate, being constructed of an electrically conductive material and connected to an RF transmission line and connector for receiving RF energy from an RF generator, for the purpose of providing an RF field for plasma enhancement. The thermal plate is configured thinner near its edges, so as to space the plate further from the susceptor and thicker near the center, placing it closer to the susceptor. The result of this variation is an increase in gas velocity as the gas moves toward the center of the susceptor and therefore wafer, decreasing the boundary layer between the reactant gas and the wafer surface wherein reactant products accumulate, overcoming gas depletion effects at the wafer center, and achieving a more uniform deposition or a wafer surface. The thermal plate also has small diameter holes drilled through to allow injection of dopant gases toward a wafer. Further control of deposition is achieved by applying an electrical bias on the susceptor for controlling the rate of incidence of ions on a wafer.

IN THE DRAWING

DESCRIPTION OF THE PREFERRED EMBODIMENT

Figure 1:
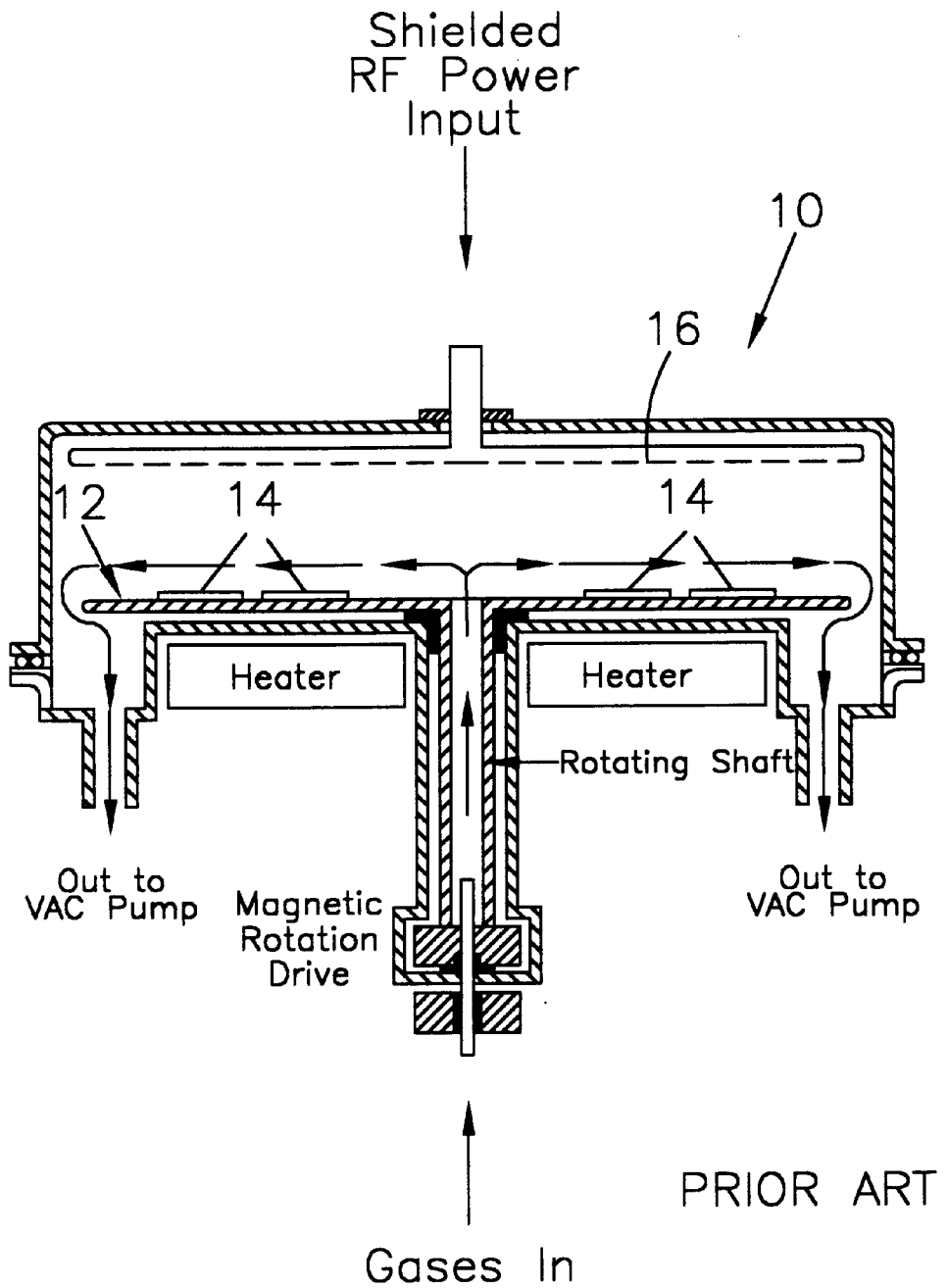
FIG. 1 shows a prior art chamber having a rotating susceptor.
Figure 2:
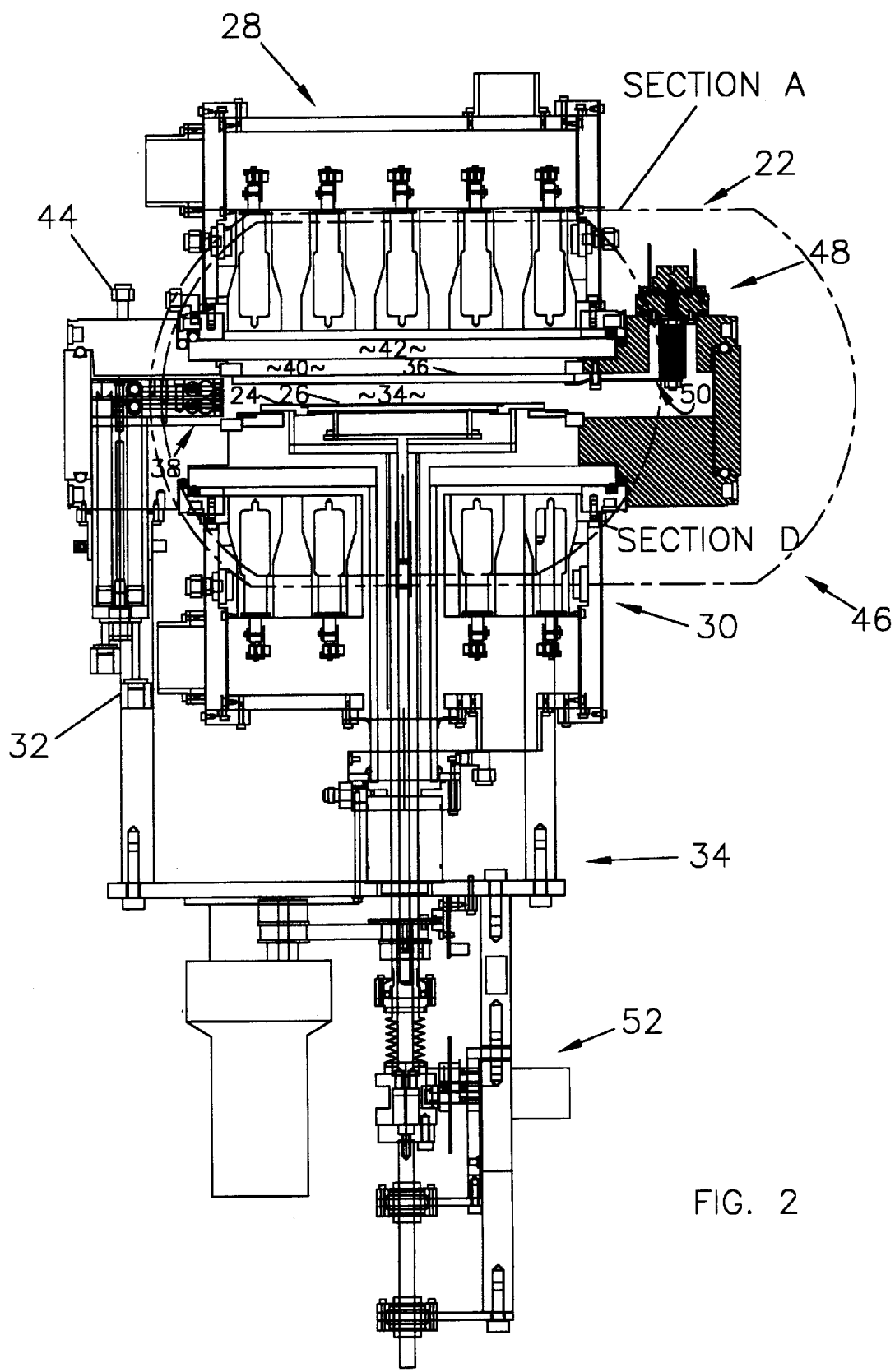
FIG. 2 illustrates a preferred embodiment of the present invention.

Referring now to FIG. 2 of the drawing, a preferred embodiment of the reactor of the present invention is shown.

The reactor 22 is similar in design and construction to the reaction chamber described in U.S. Pat. No. 5,551,985 entitled "Method and Apparatus for Cold Wall Chemical Vapor Deposition", and is incorporated herein by reference. In chamber 22, the wafer susceptor 24, and thereby also a wafer 26, is rotated while being heated from above by heaters 28, and below by radiant heaters 30. A reactant gas supply is connected to input 32, and directed to open space 34 between the thermal plate 36 and wafer 26 by injectors 38. Other gases, including inert gases, can be injected through inlet 44 to open space 40 between quartz window 42 and plate 36. The reactant gases are exhausted out the other side 46 through an outlet not shown. Reactant gas injection and exhaust apparatus details are explained in detail in U.S. Pat. No. 5,551,985.

An RF connector 48 and transmission line 50 are provided to apply RF energy to the thermal plate 36, constructed of electrically conductive material.

In operation, the reactant gas flow from the injector 38 is generally parallel to the wafer 26 surface, and is at a relatively high velocity due to the short distance between wafer 26 and the thermal plate 36. The exact distance between wafer 26 and thermal plate 36 for a particular process can be varied through use of the vertical motion mechanism 52. A high velocity reactant gas flow is beneficial in that wafer reactant gas by-products are quickly exhausted, and fresh reactant gas supplied, resulting in an increased deposition rate. The application of RF energy to plate 36 causes an RF field in the reactant gas open space 34, resulting in the creation of a plasma.

Figure 3:
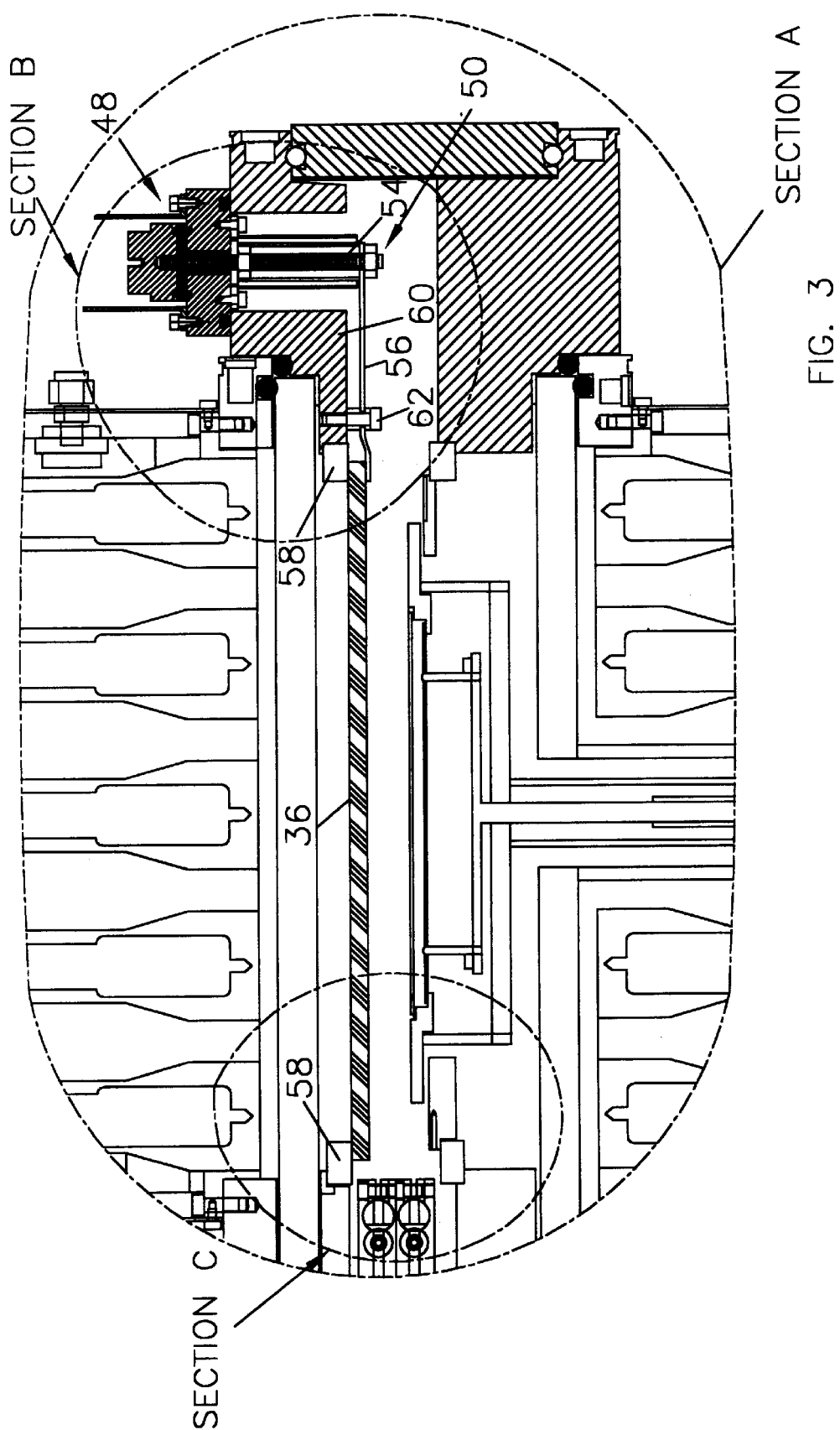
FIG. 3 shows details of construction of an RF feedthrough.

The details of construction of the RF feedthrough 48 are more clearly illustrated in FIG. 3, an enlarged view of section A of FIG. 2. The feedthrough 48 has a center conductor 54 connected to a conductive clamping strap 56. In addition to conducting RF energy to the plate 36, the strap 56 also serves to help hold the thermal plate 36 in place against an isolating quartz ring 58. The strap 56 is bolted to the grounded top plate 60 via bolt 62.

Figure 4:
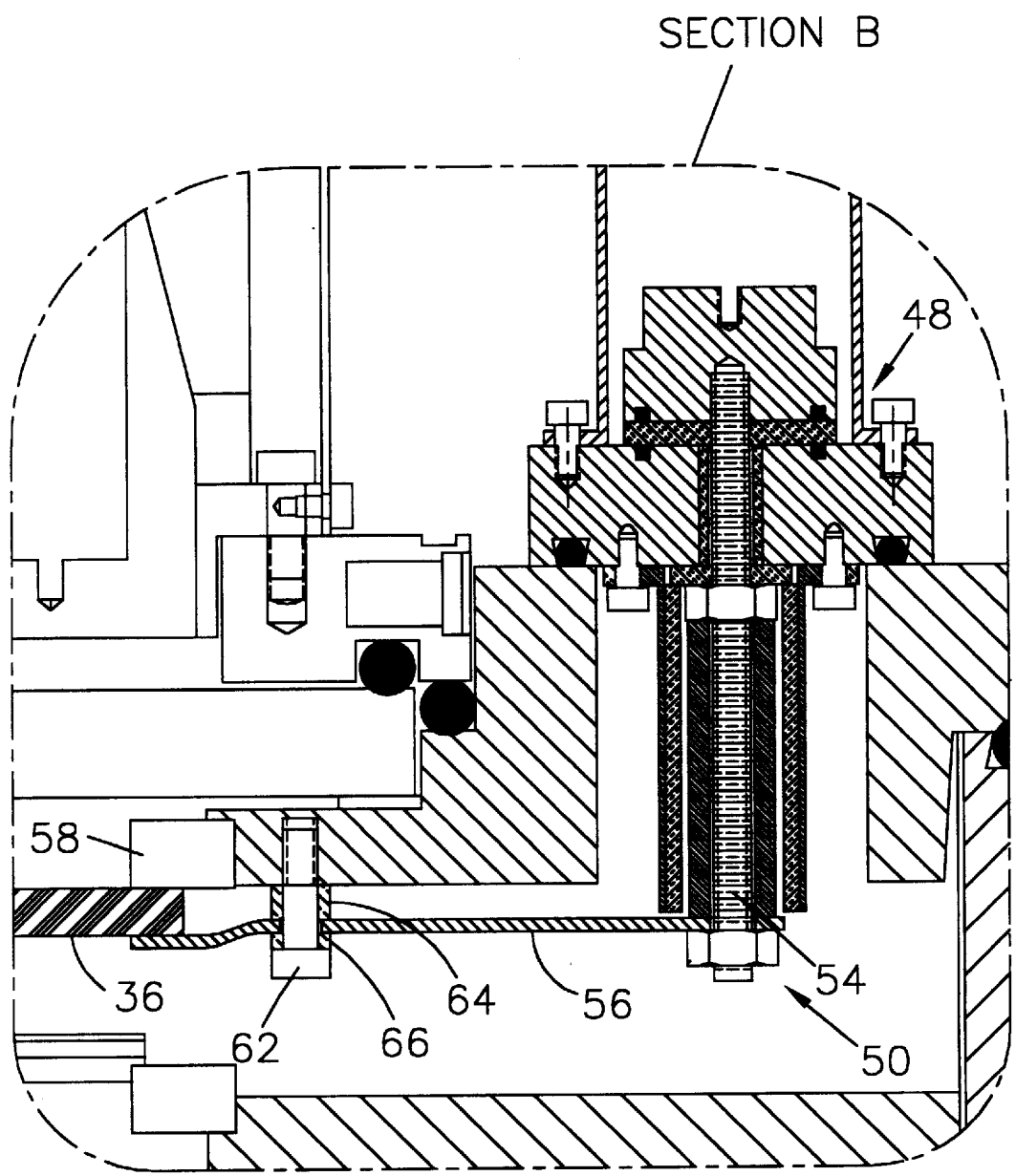
FIG. 4 shows further detail of the RF transmission line of FIG. 3.
Figure 5:
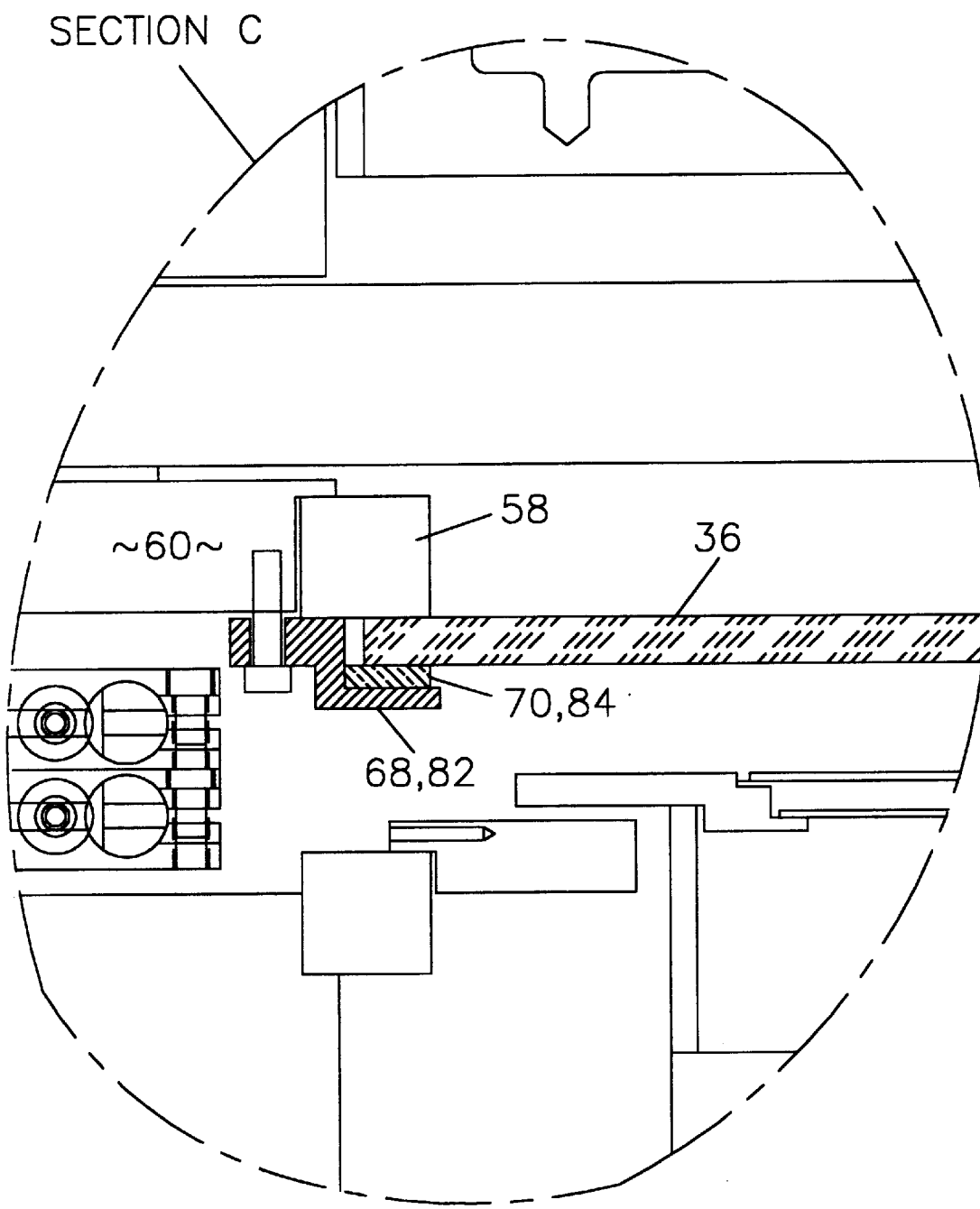
FIG. 5 is an enlargened view showing support structure for the thermal plate.

The construction of the RF feedthrough and the strap apparatus is more clearly illustrated in FIG. 4, an enlarged view of section B of FIG. 3. The connecting bolt 62 is shown to be electrically insulated from strap 56 by an insulating washer 64 and insulating shoulder washer 66. Additional clips made from the same material as strap 56 and having similar shape are bolted with insulated bolts around the periphery of the thermal plate 36 for solid support. An example of this is shown in FIG. 5, which is an enlarged view of section C of FIG. 3. Unlike the strap 56, these clips 68 extend only slightly beyond the bolts 62 in the direction away from the thermal plate 36. Also, instead of insulating the bolt from the clip 68, the clip is spaced from the plate 36 with an insulated spacer 70.

Figure 6:
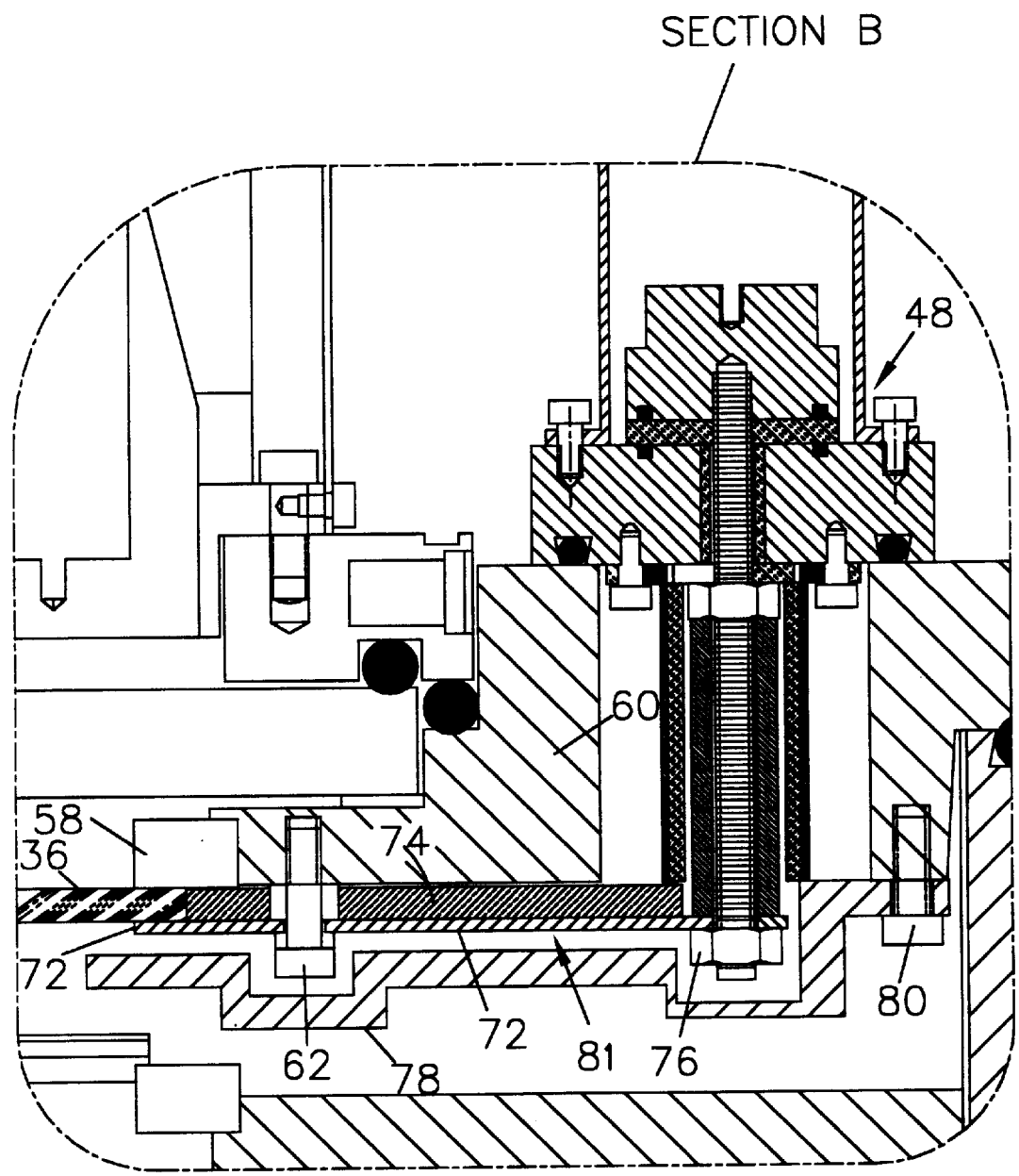
FIG. 6 shows construction of a shield forming a dark space around the RF transmission line.

An alternate embodiment of the construction of the RF feedthrough and transmission line 50 is illustrated in FIG. 6 which is an enlarged view of an area similar to section B of FIG. 3. To prevent the conductive clamping strap 56 of FIG. 4 from having a plasma created along the surfaces of the strap itself, which could cause the sputtering off of the strap's material onto the wafer, a strap 72 is provided as shown in FIG. 6. The strap 72 is insulated on its upper side by an insulator 74, made from suitable material such as ceramic or quartz. Surrounding the bottom and side edges of strap 72, and the bottom nut 76 of RF feedthrough 48 and the bolt 62 is an electrically conductive shield 78 that is directly bolted to the grounded top plate 60 by bolt(s) 80. The shape of the shield 78 is such that there is a small gap 81, typically 0.04 to 0.06 inches, between the shield 78 and the RF powered strap 72 and bottom nut of RF feedthrough 48. The small gap creates a "dark space" wherein a plasma cannot occur at typical operating pressures. The shield 78 is shown to extend slightly inward toward the center of thermal plate 36 to aid in confining the plasma to the area away from the sharp corner of the outer periphery of thermal plate 36. Referring again to FIG. 5, surrounding the remaining peripheral area of thermal plate 36 is a shaped conductive ring 82. In this case, the cross-sectional view of FIG. 5 is used to illustrate a ring 82, that is continuous around the thermal plate 36, except for a gap (not shown) to accommodate the shield 78. The ring 82 is directly bolted to the ground to the grounded top plate 60 via a plurality of bolts 62. The illustration of FIG. 5 is a valid view for either a clip 68 or a ring 82 since both have a similar cross section. Between the ring 82 and the thermal plate 36 is a ring of insulating material 84 made from a suitable material such as quartz. Again, the cross section of insulator 70 as shown in FIG. 5 is the same as ring 84 in FIG. 5. This ring of insulating material 84 also has a gap (not shown) to accommodate the shield 78. The combination of the grounded ring 82 and the insulating ring 84 prevents a plasma from occurring around the rest of the periphery of thermal plate 36.

Figure 7:
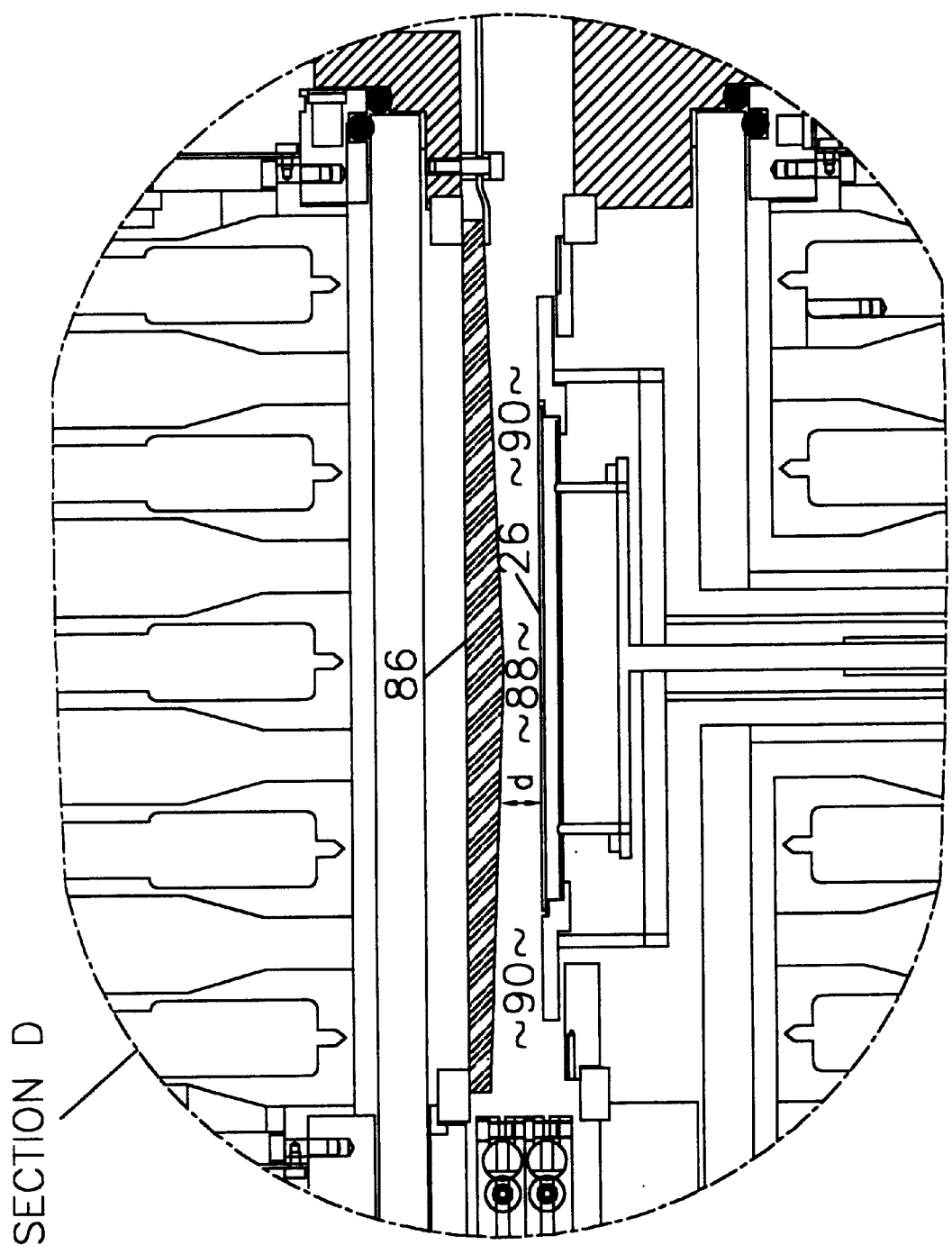
FIG. 7 shows an alternate thermal plate for controlling reactant gas velocity.

FIG. 7, an enlarged view of the area of section D of FIG. 3, shows an alternate thermal plate 86, a version of thermal plate 36, shaped in such a way that the distance "d" between the thermal plate 36 at its center 88 is shorter than the distance away from the center at 90. This has the effect of increasing the gas velocity as the gas moves toward the center 88, the increased gas flow decreasing a layer of reactant products that accumulate over the wafer surface, the layer known as a "boundary layer", and thereby overcoming gas depletion effects, a result that is important under certain process conditions for achieving a uniform thickness of deposited material across the wafer 26 surface.

Figure 8:
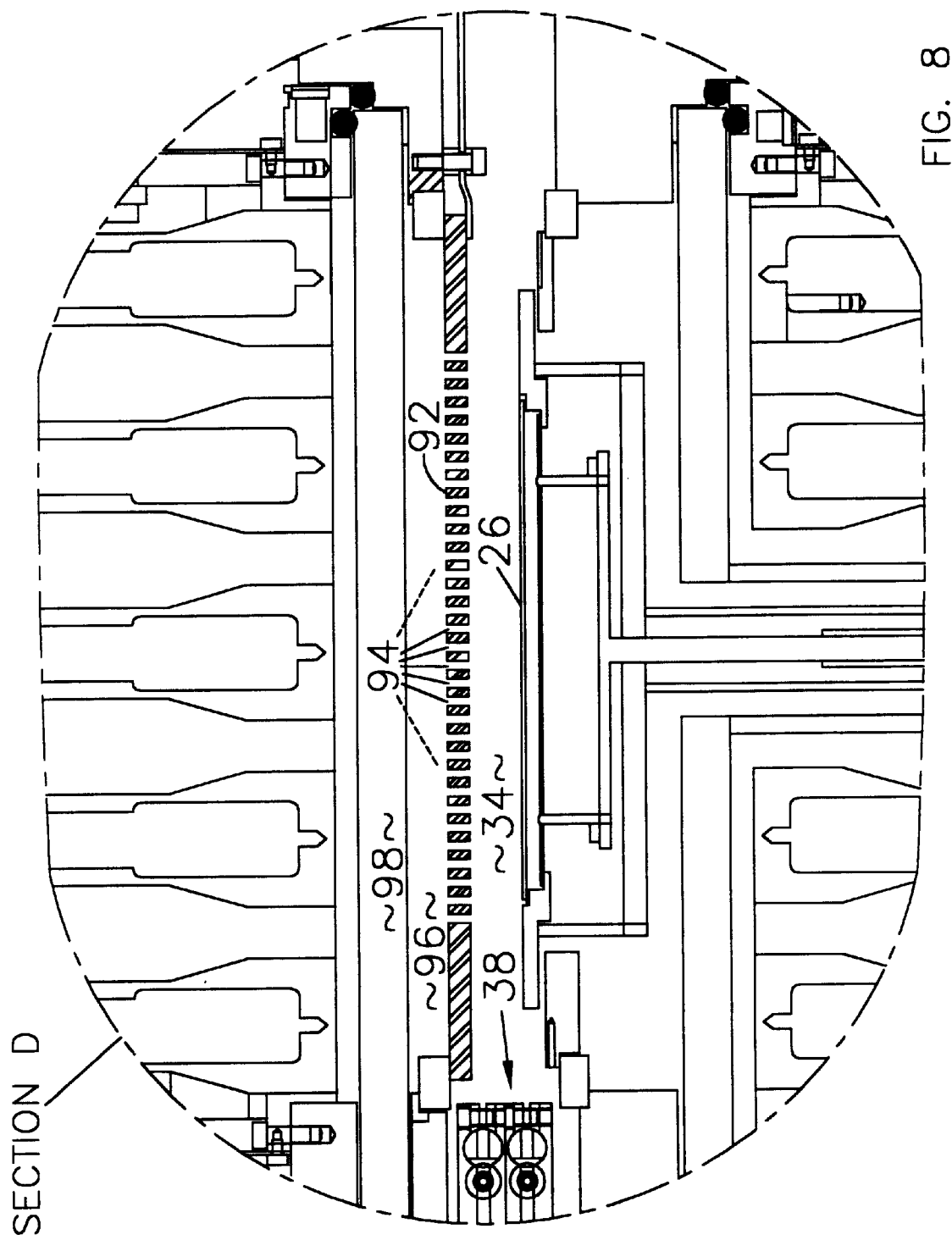
FIG. 8 is a cross sectional view showing holes through a thermal plate for injecting additional gases over the susceptor.

FIG. 8, including an area approximately equivalent to section D of FIG. 3, shows yet another thermal plate 92 version of thermal plate 36 wherein the thermal plate 92 has a number of small diameter holes 94 drilled through the plate 92 to allow the injection of gases from the open space 96 between the quartz window and plate 92, into the open space 34 above the susceptor and wafer. For example, dopant gases such a phosphine can be injected through the holes 94 in the direction toward the wafer 26, while a reactant gas such as silane (for the formation of amorphous or polysilicon) is injected by injector 38 toward the rotating wafer 26, forming the bulk of the deposited film. The dopant gas is injected into the space 96 between the thermal plate 92 and the quartz window 98 via the passageway 128 of FIG. 5 of Torrex U.S. Pat. No. 5,551,985 and is more fully described therein. A dopant gas such as phosphine will not cause a deposit on the heated quartz window 98, and will serve in the same way as an inert gas to prevent reactive gases such as silane from getting into space 96 from space 34 and reacting with the heated window to cause a deposit thereon. The spacing and size of the holes 94 in thermal plate 92 can be varied radially from the center to achieve a uniform concentration of the dopant in the bulk of the deposited film across the entire surface of the wafer 26.

Figure 9:
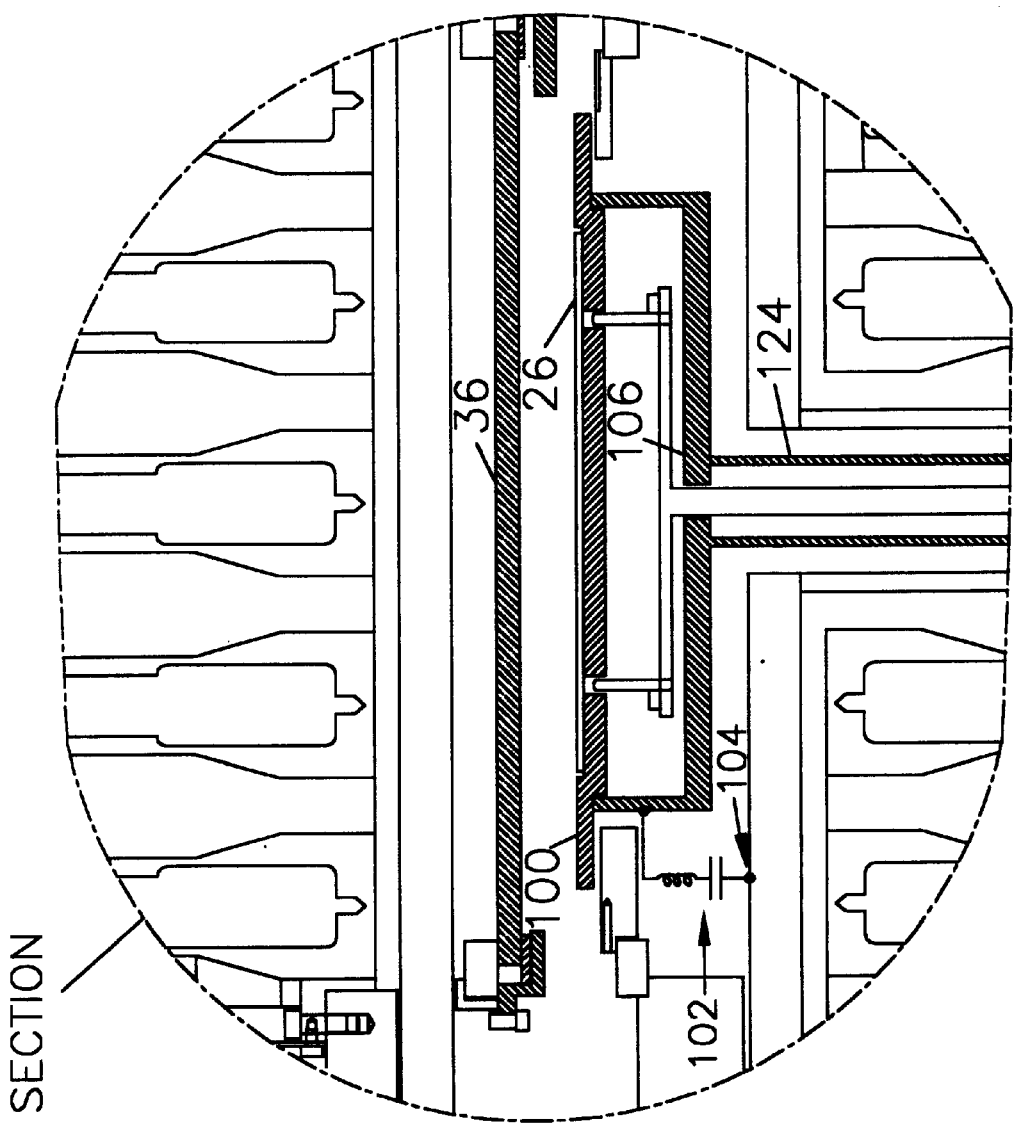
FIG. 9 illustrates application of a bias to the susceptor.

Referring now to FIG. 9, (an enlarged view of an area approximately that of section C of FIG. 2), for some processes it is desirable to bias the susceptor 100 (wafer holder) and/or the wafer 26. For example, in the PECVD of expitaxial silicon, a positive DC bias can be applied to the susceptor or wafer to retard incident ions. In other cases, the susceptor 100 and/or the wafer 26 can be biased by putting a variable LC circuit 102 (illustrated schematically) between the susceptor 100 and a ground point 104. In addition, still other processes can benefit by applying to the susceptor 100 RF energy of a different frequency than that of the RF energy applied to the main electrode (thermal plate 36). To permit such biasing and/or the application of RF energy to the susceptor, the susceptor 100 can be made of conductive material such as graphite. The susceptor 100 rests upon the rotating susceptor holder 106, which is also electrically conductive. The DC bias or connections of resonant circuit 102, and/or connections of RF energy can be coupled to the susceptor holder 106 via a commercial rotating electrical connector such as supplied by Mercotac, Inc., Carlsbad, Calif. or via the type of rotating RF feedthrough of FIG. 10, fully described in U.S. Pat. Ser. No. 60/071,571 entitled "Vertical Plasma Enhanced Process Apparatus and Method", and incorporated herein by reference.

Figure 10:
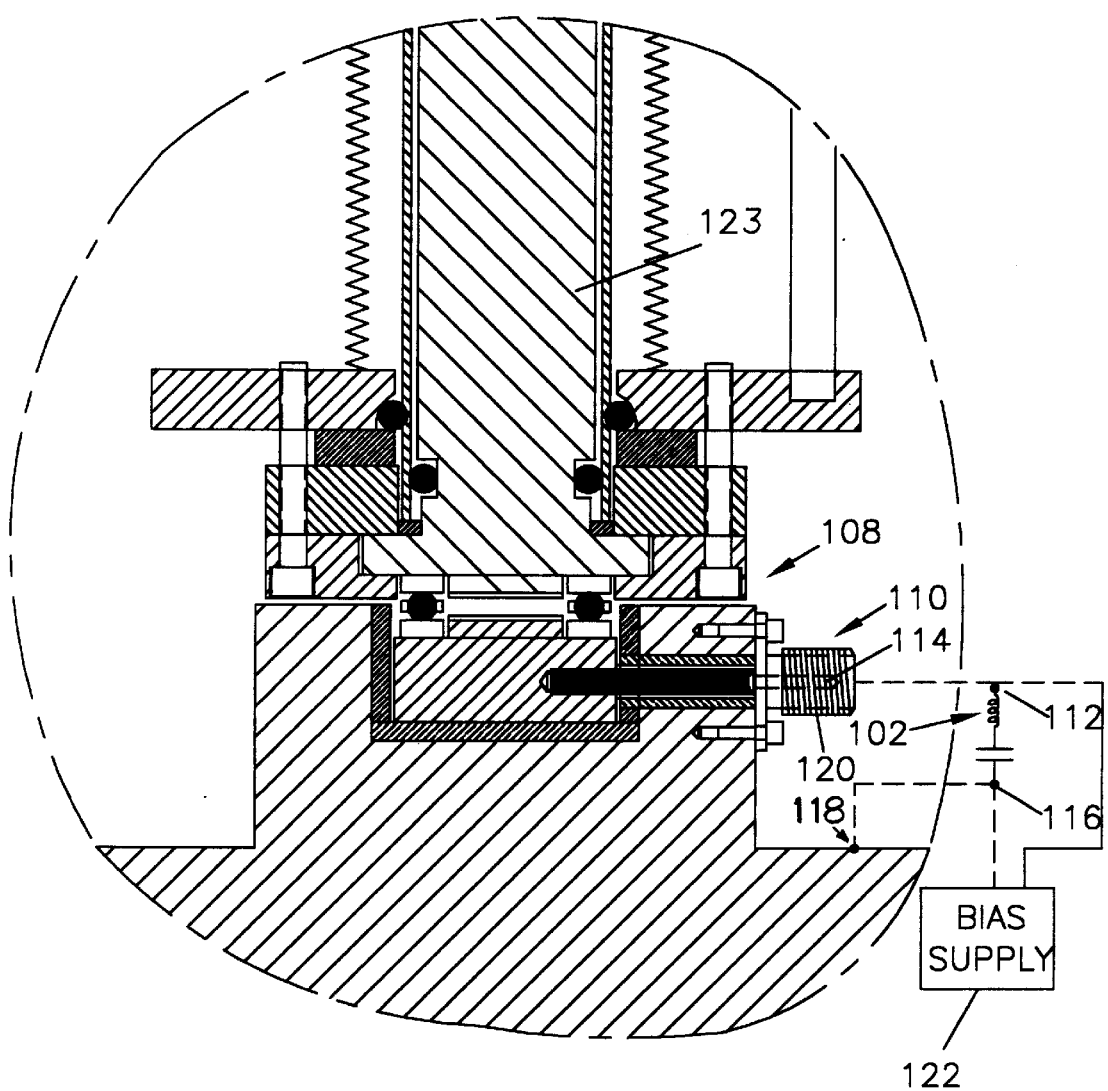
FIG. 10 is a view of a rotating electrical connection.

Referring now to FIG. 10, a rotating electrical connection apparatus 108, as described in U.S. Ser. No. 60/071,571, includes an electrical connector 110.

If the bias circuit 102 is used, one side 112 is connected to a center conductor 114 of the connector 110, and the return side 116 is connected to a ground point 118, connected to the connector outer conductor 120. Alternatively, a bias supply 122 is connected as shown instead of the circuit 102. The rotating connection 108 connects center conductor 114 to the electrically conductive shaft 123, which is connected mechanically and electrically to the shaft 124 of FIG. 9 connected to the susceptor 100. The details of a vertical rotating mechanical and electrical connection are given in U.S. Ser. No. 60/071,571.

Although a preferred embodiment of the present invention has been described above, it will be appreciated that certain alterations and modifications thereof will be apparent to those skilled in the art. It is therefore intended that the appended claims be interpreted as covering all such alterations and modifications as fall within the true spirit and scope of the invention.

What is claimed is:

1. A plasma enhanced chemical vapor deposition (PECVD) reactor comprising:
   (a) a chamber;
   (b) a susceptor within said chamber for holding a wafer;
   (c) a window;
   (d) an electrically conductive thermal plate positioned above said susceptor and below said window providing a first space between said window and said thermal plate, and wherein said thermal plate includes a plurality of openings for passage of a dopant gas from said first space;
   (e) first injecting apparatus for injecting said dopant gas to said first space between said thermal plate and said window;
   (f) second injecting apparatus for injecting a reactant gas mixture to a second space between said susceptor and said thermal plate; and
   (g) apparatus for applying RF energy to said thermal plate.

2. A reactor as recited in claim 1 further comprising bias means for applying a DC voltage on said susceptor for controlling the rate of incidence of ions on the wafer.

3. A plasma enhanced chemical vapor deposition (PECVD) reactor comprising:
   (a) a chamber;
   (b) a susceptor within said chamber for holding a wafer;
   (c) an electrically conductive thermal plate positioned above said susceptor;
   (d) first injecting apparatus for injecting a first reactant gas mixture to a first space between said susceptor and said thermal plate;
   (e) apparatus for applying RF energy to said thermal plate;
   (f) a window spaced above said thermal plate;
   (g) second injecting apparatus for injecting a second gas to a second space between said thermal plate and said window; and
   (h) lifting apparatus for placing said wafer in a preferred position for said deposition, said position being a preferred distance between said thermal plate and said wafer.

4. A reactor as recited in claim 3 further comprising bias means for applying a DC voltage on said susceptor for controlling the rate of incidence of ions on the wafer.

5. A PECVD reactor comprising:
   (a) a chamber;
   (b) a susceptor within the chamber for holding a wafer;
   (c) an electrically conductive thermal plate positioned above the susceptor, the thermal plate configured to have a convex shape so that the distance between the thermal plate at the center of the wafer is less than the distance between the thermal plate and the wafer at the edge of the wafer for controlling the speed of a reactant gas flowing across said wafer;
   (d) means for applying RF energy to the thermal plate;
   (e) first injecting means for injecting a first reactant gas mixture to a first space between the susceptor and the thermal plate;
   (f) a window spaced above the thermal plate; and
   (g) second injecting means for injecting a second gas to a second space between the thermal plate and the window.

6. A reactor as recited in claim 5 further comprising means for lifting said wafer for the purpose of adjusting the distance between said thermal plate and said wafer.

7. A reactor as recited in claim 5 further comprising bias means for applying a DC voltage on said susceptor for controlling the rate of incidence of ions on the wafer.

8. A PECVD reactor comprising:
   (a) a chamber;
   (b) a susceptor within the chamber for holding a wafer;
   (c) an electrically conductive thermal plate positioned above the susceptor, the thermal plate configured to have a convex shape so that the distance between the thermal plate at the center of the wafer is less than the distance between the thermal plate and the wafer at the edge of the wafer for controlling the speed of a reactant gas flowing across said wafer;
   (d) means for applying RF energy to the thermal plate;
   (e) first injecting means for injecting a first reactant gas mixture to a first space between the susceptor and the thermal plate;
   (f) means for lifting the wafer for the purpose of adjusting the distance between the thermal plate and the wafer;
   (g) bias means for applying a DC voltage on said susceptor for controlling the rate of incidence of ions on the wafer;
   (h) window means spaced above said thermal plate; and
   (i) second injecting means for injecting a second gas to a second space between said thermal plate and said window means.

* * * * *